(12) United States Patent
Wangen

(10) Patent No.: US 6,327,156 B1
(45) Date of Patent: Dec. 4, 2001

(54) SHIELDED MODULAR HOUSING FOR A SUBSTRATE

(75) Inventor: Olav Wangen, Horten (NO)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/452,871

(22) Filed: Dec. 2, 1999

(30) Foreign Application Priority Data

Dec. 23, 1998 (NO) .................................................... 986129

(51) Int. Cl.⁷ ...................................................... H05K 7/14

(52) U.S. Cl. .......................... 361/759; 361/736; 361/742; 361/752; 361/753; 361/801; 361/816; 174/138 G

(58) Field of Search ..................................... 361/728, 726, 361/752, 753, 759, 742, 796, 800, 801, 720, 804, 816, 818, 799; 174/35 R, 35 GC, 51, 138 G; 211/41.17; 206/719

(56) References Cited

U.S. PATENT DOCUMENTS

| | | | |
|---|---|---|---|
| 4,661,888 | * | 4/1987 | Jewell et al. ........................... 361/818 |
| 5,107,404 | * | 4/1992 | Tam ...................................... 361/818 |
| 5,373,104 | * | 12/1994 | Brauer ................................. 174/52.1 |
| 5,550,712 | * | 8/1996 | Crockett .............................. 361/752 |
| 5,677,830 | * | 10/1997 | Nogas et al. ......................... 361/790 |
| 5,867,369 | * | 2/1999 | Antonuccio et al. ................ 361/796 |
| 6,043,981 | * | 3/2000 | Markow et al. ..................... 361/704 |

* cited by examiner

Primary Examiner—Jayprakash N. Gandhi
(74) Attorney, Agent, or Firm—Sughrue, Mion, Zinn, Macpeak & Seas, PLLC

(57) ABSTRACT

A modular housing for a substrate with electronic components, wherein the housing comprises at least a base part and a cover part. The parts of the housing consist of an electrically conductive material for electromagnetic shielding and form outer walls enclosing a space inside the housing which accommodates the substrate. Dividing walls extend in the space inside the housing and have free edges which support the substrate.

21 Claims, 5 Drawing Sheets

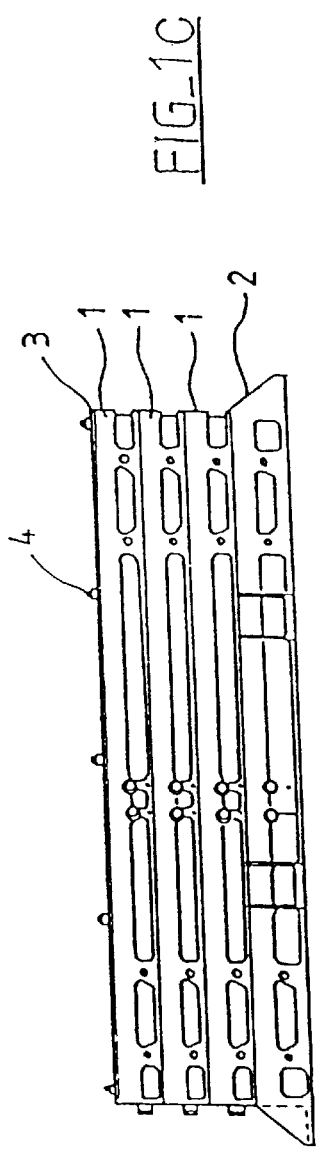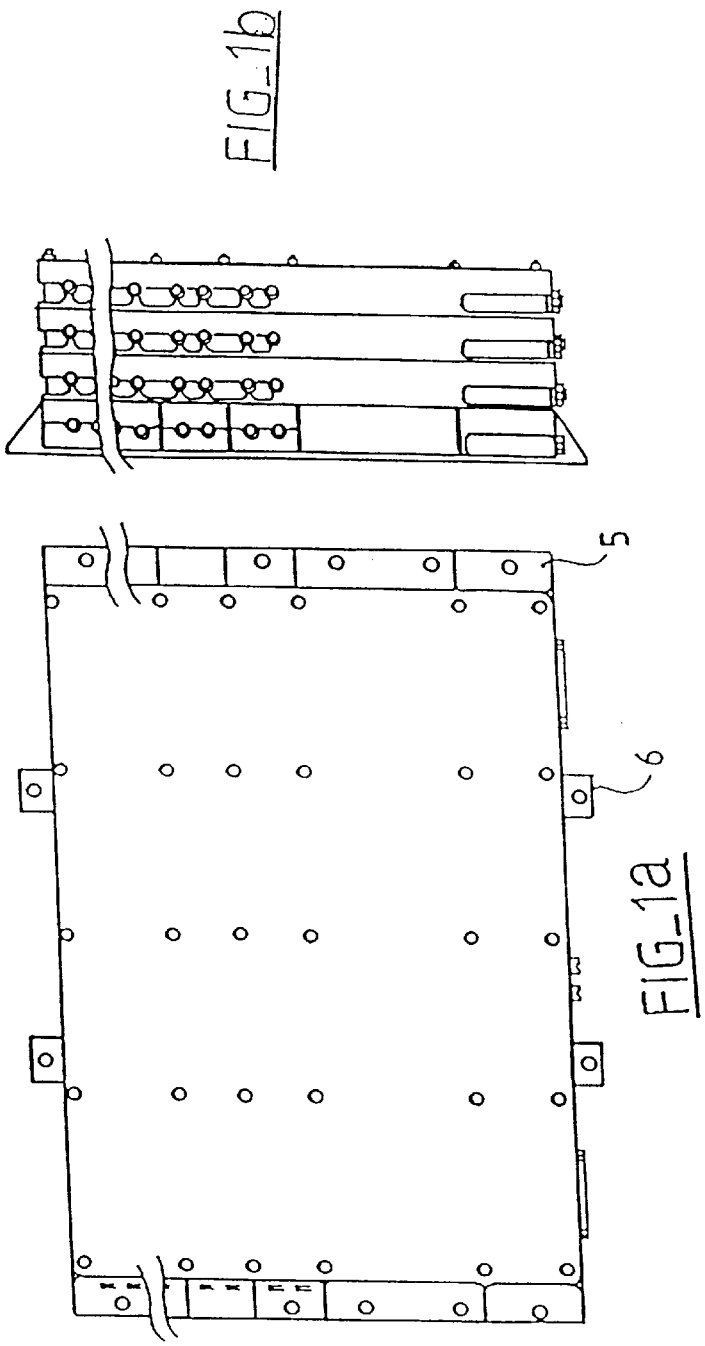
FIG_1c
FIG_1b
FIG_1a

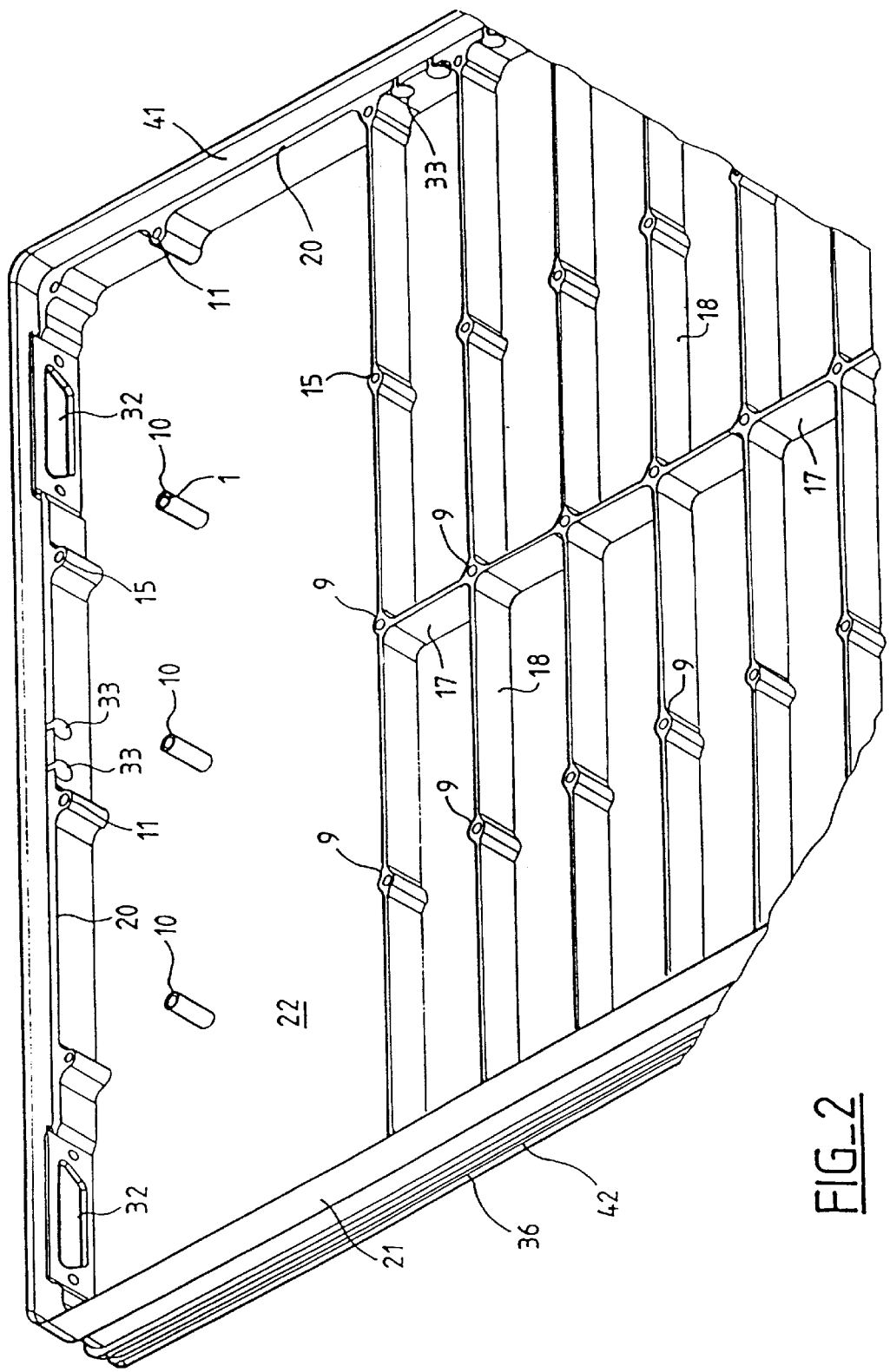
FIG_2

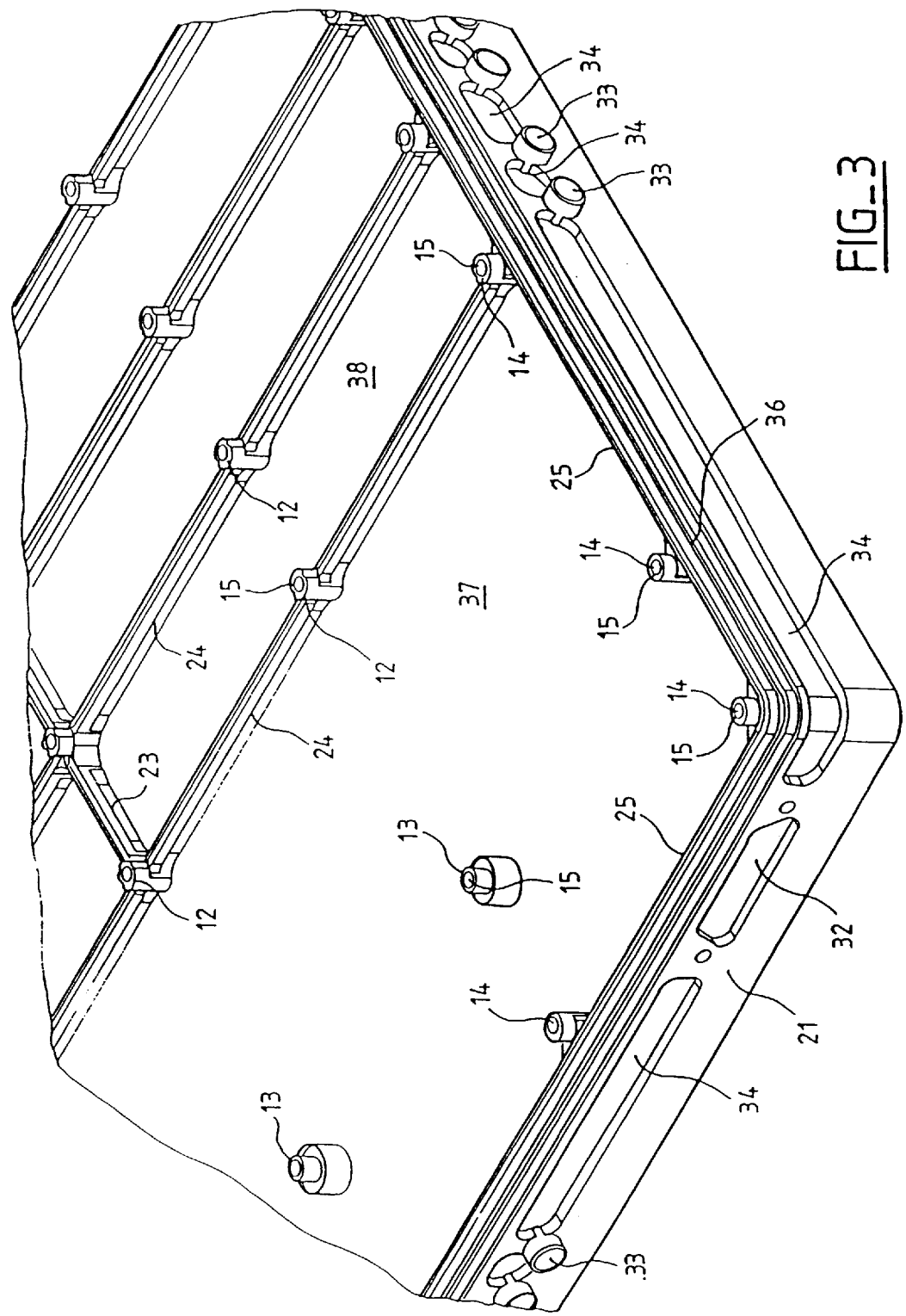

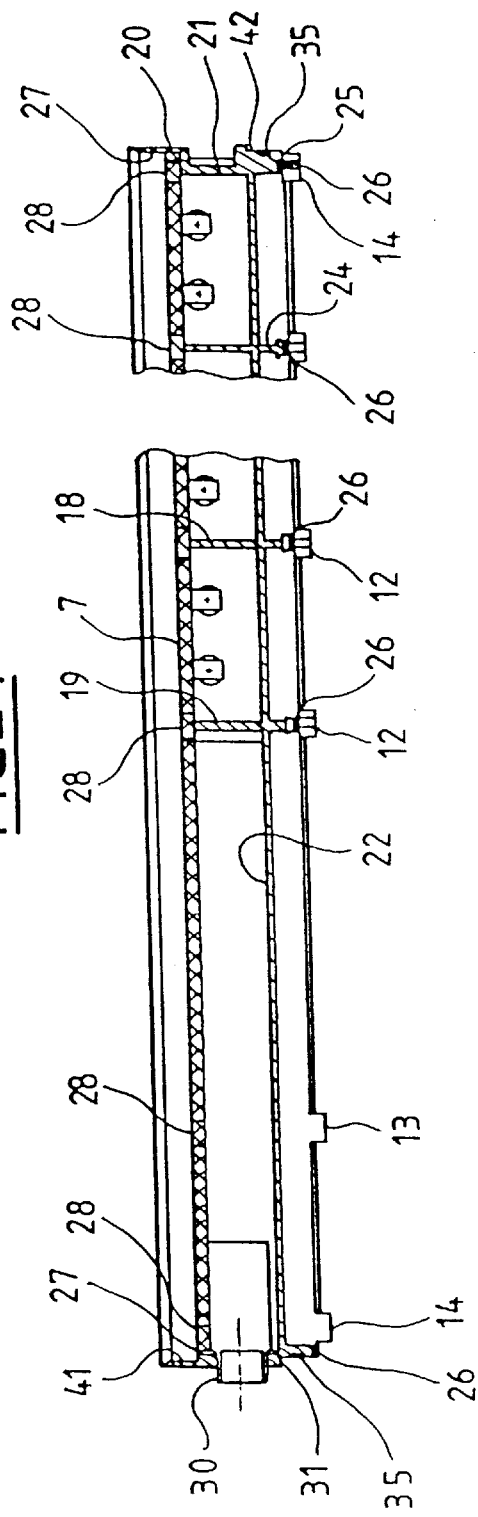
FIG_4
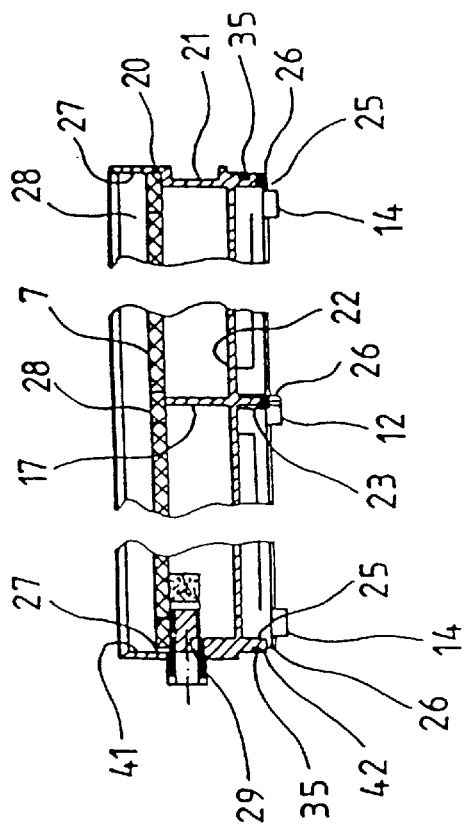
FIG_5

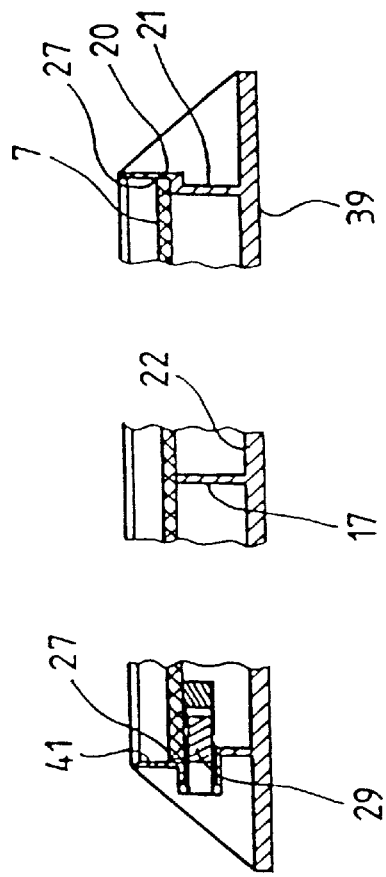
FIG_6
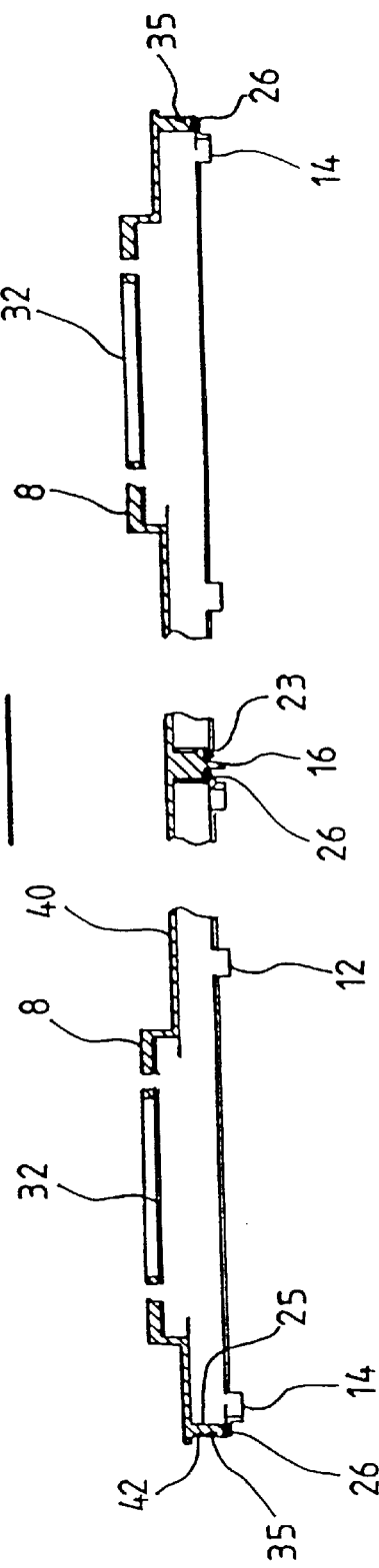
FIG_7

SHIELDED MODULAR HOUSING FOR A SUBSTRATE

BACKGROUND OF THE INVENTION

The present invention relates to a modular housing for a substrate with electronic components, wherein the housing comprises at least a base part and a cover part, wherein the parts of the housing consist of an electrically conductive material for electromagnetic shielding and form outer walls enclosing a space inside the housing which accommodates the substrate, wherein dividing walls extend in the space inside the housing and have free edges which support the substrate.

Electronic components which are mounted on a substrate, generally a printed circuit board, are often enclosed in a housing which consists of an electrically conductive material for electromagnetic shielding. To allow easy assembling and dismantling of the housing, e.g. for service purposes, it consists generally of two or more parts which are fixed to each other by connection means, for example screws.

In some cases, it is necessary to shield different sections of a substrate against each other because interference may disturb the circuits, especially if radio frequency circuits are mounted on the substrate. For this purpose, a housing with dividing walls inside the space for the substrate is described in U.S. Pat. No. 4,661,888. The housing consists of a base plate and two cover plates on opposite sides of the base. Both the base and the covers have dividing walls supporting a substrate which is located between the base and a cover. The free edges of the dividing walls contact continuous grounding strip conductors on the substrate. In this way, different sections of the substrate are shielded against each other. The contact between the walls and the conducting strips is improved by conductive elastomer gaskets which are disposed on the edges of the walls.

In the design described above, the connecting means press the parts of the housing onto the opposing sides of the substrate, i. e. the substrate separates the parts from each other. Consequently, the mechanical stability of the housing is limited by the properties of the substrate. In most cases, the thermal expansion coefficients of the housing and the substrate differ. This causes mechanical stress which may lead to damage of the electronic circuits on the substrate when the housing is subject to temperature changes resulting from external influences or heat generation from components inside. Mechanical stress can also be caused by tolerances in the dimensions of the parts or improper fixing of the parts to each other. Finally, in the state of the art the cooling of the components in the housing is achieved by air circulation through holes in the outer walls which impair the shielding. However, thermal air circulation is not possible for space applications. Consequently, other means for heat dissipation have to be developed.

SUMMARY OF THE INVENTION

It is therefore an object of the invention to obviate these disadvantages and develop a modular shielding housing which is strong and avoids mechanical stress of the substrate. It is a further object to provide a housing which has a good heat dissipation from the electronic components enclosed inside without using air circulation. Still another object of the present invention is to develop a housing which is optimized for minimum mass.

According to the present invention, at least one of said parts is provided with spacers which are in mechanical and thermal contact with an adjacent part and which define the height of the space inside the housing.

The basic concept of the invention is to provide spacers which extend through the space inside the housing. The spacers form a continuous mechanical and thermal connection between adjacent parts of the housing. Consequently, they define the height of the space inside. The free space is dimensioned to accommodate the substrate with the electronic components. For this purpose, the spacers ensure that there is a gap between the dividing walls on opposing sides of a substrate and the width of the gap is at least equal to the thickness of the substrate. A preferred shape of the parts are slices aligned parallel to the substrates.

Generally, there is some free space around the substrate, especially at its edges, to allow for thermal expansion. The clearances at the edges of a substrate are limited by the outer walls of the housing and the spacers. It is possible that there is only one substrate between two adjacent parts of the housing but there may also be several substrates in the same plane if the space is sufficient.

The connections from the substrates to elements outside of the housing or between different substrates are obtained preferably by flexible or semi-flexible connections. Alternatively, sliding connections may be used. In many cases it is of advantage if connections from the housing to outside components are located only on one of its parts, preferably on the base part. This allows to open the housing, e.g. for service or adjustment, by removal of the cover while leaving the connections in place. To ensure a sufficient cooling of the housing, one of its parts, preferably the base, can be coupled to a supporting structure which dissipates the heat.

The proposed design has the advantage that mechanical forces on the housing, especially pressures, are not transferred to the substrate inside but rather by the spacers between the outer walls. Furthermore, the spacers conduct heat generated inside the housing by thermal contact to its outer walls. Because the spacers in conjunction with the dividing walls improve the stability of the housing, the weight may be low while retaining a good stability.

In an advantageous embodiment of the invention, the housing comprises one or more intermediate parts located between the base part and the cover part. In this case, a substrate can be located in a gap between the base part and an intermediate part, between the cover part and an intermediate part or between two intermediate parts. The modular construction offers the opportunity to adapt the size of the housing to different numbers of substrates by using different numbers of intermediate parts. Like the base and the cover part, the intermediate parts are provided with dividing walls for supporting one or several substrates. The intermediate parts are also provided with spacers for defining the height of the space inside the housing, especially the width of the gaps for accommodating the substrates.

Preferably, the parts of the housing are one-piece parts comprising the outer walls, the dividing walls and the spacers. The parts may either be machined parts or castings, facilitating a suitable shape and size of the housing. A good electrical conductivity and a low mass of the housing can be attained by parts made from aluminum or a magnesium alloy.

The spacers may be located exclusively on one of the adjacent parts and extend all the way through the space inside the housing to the outer wall of another part. It is preferred, however, that a spacer touches the face of another spacer in the adjacent part of the housing. In this case, the spacers are segments of a larger mechanical and thermal connection through the housing.

Fastening means are of advantage to join different parts of the housing to each other and the housing to a support. Suitable means are for example screws or pin screws. In a preferred embodiment of the invention, some or all spacers include a hole to accommodate the fastening means. The location of the fastening means inside the spacers reduces strains in the housing. In addition, a good thermal and mechanical contact between the spacer and an adjacent part of the housing, especially between adjacent spacers is ensured. Especially if the fastening means are used to attach the housing to a support, continuous holes running through the whole housing are preferred. It is, however, possible that holes extend only through a part of a spacer. If screws are used as a fastening means, the inner surfaces of the holes may be threaded.

The spacers can be located at any position inside the housing which is suitable to attain a good mechanical stability and leaves sufficient space for the substrates. It is preferred, however, that spacers are part of the dividing walls, especially if the number of dividing walls inside the housing is large, or the outer walls. For example, a spacer may be a protrusion on the edge or side of a wall. Alternatively, a dividing wall with a larger height than neighboring dividing walls may serve as a spacer. The latter embodiment is of advantage if substrates in the same plane have to be shielded against each other.

The mechanical stability and heat conduction of the housing are increased if the distance between neighboring spacers is low. The resulting problem of accommodating large substrates inside the housing can be solved by a substrate that has recesses, e.g. holes, for the spacers. This allows for a diameter of the substrate which is larger than the distance of neighboring spacers.

It is preferred that the arrangement of the dividing walls on opposite sides of a substrate is identical. This allows to subdivide the space inside the housing into compartments. In this way, the mechanical stability of the housing is improved and it is possible to shield substrates in the same layer against each other or sections of a single substrate against each other. To improve shielding, it is proposed that the edges of the dividing walls are in contact with conducting grounding strips on the surface of the substrate. Nevertheless, the arrangement of the dividing walls can be different on opposite sides of an intermediate part.

For the purposes of shielding, especially in the latter case, improved thermal conduction and better mechanical stability, the intermediate part may be provided with one or several additional dividing walls extending parallel to the substrates. In many cases, a single dividing wall extending throughout the whole intermediate part is most preferred.

In an advantageous embodiment of the invention, the outer walls of adjacent parts of the housing overlap. This improves the shielding of the internal components from the outside, even if there are small variations in the distance of the parts.

Due to tolerances necessary for assembly and different thermal expansion, there are generally small gaps between elements of the housing, especially between the outer walls of adjacent parts or between the substrates and the dividing walls. To close these gaps, it is proposed that elastic gaskets are located at the edges of the outer walls and the dividing walls. If adjacent walls overlap, the gasket can also be located in the overlapping region. Gaskets made from an electrically conductive material improve the shielding. The gasket can be fixed in a continuous groove running along the wall or between protrusions on the wall. As an alternative to a gasket, a more permanent bonding is possible, e.g. by a conducting adhesive.

It is furthermore proposed that all gaskets at the edges of dividing walls which are in contact with an individual substrate are located exclusively on one side of the substrate. As a result, the elastic gaskets press the substrate against the edges of the dividing walls on the opposite side. In this way both a good electrical connection for grounding and a good thermal connection to the dividing walls is ensured while allowing for different thermal expansion of the substrate and the housing.

Electronic components and circuits inside the housing can differ to a large extent in their heat generation and their sensitivity to outer influences like electromagnetic interference or cosmic radiation. To meet the different requirements, the diameters of the dividing walls, the outer walls and the spacers can vary to attain the necessary heat conduction or to increase radiation shielding which is of special importance if the housing is used in outer space. The variations of the dimensions may be limited to a local region of a wall or spacer or only to some spacers.

The foregoing and other objects, features and advantages of the present invention will become more apparent in the following detailed description of a preferred embodiment as illustrated in the accompanying drawings.

BRIEF DESCRIPTION OF THE DRAWINGS

FIGS. 1a–1c show different views of a housing according to the invention.

FIG. 2 is a perspective view of an intermediate part of the housing seen from the top.

FIG. 3 is a perspective view of the intermediate part in FIG. 2 seen from the bottom.

FIG. 4 is a cross section of an intermediate part.

FIG. 5 is another cross section of an intermediate part.

FIG. 6 is a cross section of the base part of the housing.

FIG. 7 is a cross section of a cover part.

DETAILED OF DESCRIPTION OF THE INVENTION

The housing of the present invention comprises at least a base part (2) and a cover part (3) clamped together with screws or pin screws (4). In its simplest form, the housing consists only of base part (2) and cover part (3). Normally, however, the assembled housing comprises one or more intermediate parts (1) as shown in FIGS. 1a–1c. The intermediate part (1) closest to base part (2) serves as a cover to base part (2), the second intermediate part (1) serving as a cover to the first one and so on with cover part (3) on top of the stack. Each part (1–3) is preferably machined or cast in one piece.

Inside the housing between the parts (1–3) there are substrates (7), e.g. printed circuit boards. Each intermediate part (1) and the base part (2) can accommodate one or more substrates (7) as indicated in the front view cross section in FIG. 4 and the rear view cross section in FIG. 5.

Most elements of the invention are apparent in the perspective views in FIG. 2 and FIG. 3 showing an intermediate part (1) which is the basic construction element of the housing. Elements which can be mounted inside the part (1) are omitted for simplicity.

A core element of the invention is the mechanical support and the thermal conductive connection provided by spacers (9–14) which can be part either of internal dividing walls (spacers 9, 12) or stand alone (spacers 10, 13) or be part of an outer wall (spacers 11, 14). After assembly of the housing, the spacers (9–14) in adjacent parts (1–3) touch each other with their upper and lower faces forming segments of a continues structure. The spacers (9–11) are in immediate contact with corresponding spacers (12–14) on the bottom side of the adjacent part (1, 3) through recesses (28), e.g. holes, in the substrates (7). This gives a continues vertical path with low thermal and electrical resistance. The resistance value can easily be adjusted by varying the diameter of the spacers (9–14). The diameter can vary locally for one or a few of the spacers (9–14) or for all, as required by the necessary internal heat dissipation. Spacers can also be formed as dividing walls (16) with a larger height which rest directly on the dividing wall (23, 24) of an adjacent part (1–3).

In order to maintain a good contact, some or all spacers have holes (15) to accommodate screws or pin screws (4) which hold the parts (1–3) together. The screws engage threads in the base part (2), or go through the complete housing into a supporting structure or panel.

A cross section of base part (2) is shown in FIG. 6. The main difference compared to an intermediate part (1) is that the outer wall forming the bottom (39) of base part (2) is flat. In addition, base part (2) is provided with means for the thermal and mechanical connection to an outside structure supporting the housing, e. g. a panel at the next integration level. Suitable connection means include mounting flanges (5) and feet (6) The bottom (39) serves as the main conductive thermal interface to the supporting structure or panel.

FIG. 7 shows a cross section of cover part (3). It is also a modified version of an intermediate part (1). The outer wall forming the top side (40) of the housing can either be flat or have means for the mechanical, thermal or electrical connection with elements outside the housing, e.g. protrusions (8) to accommodate connectors in openings (32).

Another element of the invention is the support of the substrates (7) inside the housing. The support allows for variations from production tolerances and thermal mismatch. Internal dividing walls (16 - 18) subdivide the inner space of the housing into compartments (38). The substrates (7) rest freely on the edges of the dividing walls (17, 18) and on a ledge (20) on the inside of outer wall (21). The dividing walls (17, 18) and the ledge (20) have the same height measured from the plane of a horizontal dividing wall (22) of an intermediate part (1) or the bottom (39) in the case of base part (2).

The next part (1, 3) in the stack has dividing walls (23, 24) and an edge (25) of an outer wall (21) in positions which correspond to the walls (17, 18) and ledge (20). The edges of the dividing walls (23, 24) and the edge (25) are provided with an elastic, preferably electrically conductive gasket (26) placed in a groove. After assembly of the housing, the gaskets (26) which are located only on one side of the substrates (7) clamp it down against the edges of the dividing walls (17, 18) and ledge (20) on the opposite side. This ensures a controlled contact pressure between the substrates (7) and their supporting structures providing both a good electrical connection for grounding and good thermal paths to the outside of the housing because the gasket (26) accommodates for production tolerances and thermal expansion mismatch in the vertical direction.

The substrates (7) are covered with a conductive strip or a ground plane in all areas resting on the dividing walls (17, 18) and ledge (20) and preferably in the areas contacting the gaskets (26). In this way, the good electrical and thermal contact between the substrates (7) and the parts (1–3) of the housing is improved further.

The walls (16–18, 21–24) also serve as thermal shunts reducing temperature differences across the substrates (7). At the same time, they thermally connect all areas of the substrates (7) to the spacers (9–14). Sections (19) of the dividing walls have an increased thickness in order to optimize the thermal conduction while maintaining a minimum total mass of the housing. Furthermore, the wall system also provides a shielding between the compartments (38) in the housing and ensures, together with the spacers (9–14), an extremely good mechanical stiffness.

To compensate for thermal mismatch and production tolerances in the horizontal direction, there are clearances (27) between the edges of the substrates (7) and the outer walls (21). For the same reason, the recesses (28) or holes in the substrates (7) are slightly larger than the diameter of the corresponding spacers (9–14).

Connections from the substrate to the outside of the housing or between different substrates are preferably obtained by flexible connectors (29), sliding connectors (30) or a combination of both. In the case of sliding connectors (30), the clearance between the outer wall (21) and the connector on the substrate (7) is normally sealed with a conductive gasket (31). Sliding connectors (30) are accommodated in openings (32) with an approximately trapezoidal shape while openings (33) with a round cross section accommodate flexible connectors (29).

On the outer wall (21) of base part (2) and the intermediate parts (1), there is an overlap region (41) which is after assembly of the housing located in the recess (42) of an adjacent intermediate part (1) or cover part (3). When the parts (1–3) are stacked, the overlaps are sealed with elastic conductive gaskets (35), preferably placed in a groove (36). Recesses (34) reduce the thickness of the outer walls (21) locally to lower the total mass of the housing while retaining a good mechanical stability.

Variations of this basic design comprise a single or more and smaller substrates (7). Another possibility is to have different sizes of the compartments (38) in different parts (1–3) of the housing. For example, there can be smaller compartments (38) in base part (2) and larger compartments adjacent to cover part (3). Preferably, also in this case the dividing walls (23, 24) in the cover part (3) are in registry with dividing walls (16–18) in the base part (2). If spacers are not at matching positions throughout the whole stack of parts (1–3), the screws through the holes (15) may stop at the respective part (1).

In the manner described above, a modular and strong multi-compartment housing is designed which can be optimized for minimum mass. It provides good electromagnetic shielding for the enclosed components avoiding radiation from the inside, susceptibility from electromagnetic interference and cosmic radiation. Electromagnetic shielding between components in different compartments of the housing is also possible. There is a good thermal conductive coupling to the base part from distributed areas inside the housing which allows for rapid heat conduction to underlying structures. Finally, mechanical stress caused by production tolerances or different thermal expansion between construction elements is avoided.

The above embodiments admirably achieve the objects of the invention. However, it will be appreciated that departures can be made by those skilled in the art without departing from the scope of the invention which is limited only by the claims.

What is claimed is:

1. A modular housing for a substrate with electronic components, wherein the housing comprises:
   at least a base part and a cover part, wherein the parts of the housing comprise:
      an electrically conductive material providing electromagnetic shielding and forming outer walls enclosing a space inside the housing which accommodates the substrate, and
      dividing walls extending in the space inside the housing and having free edges which support the substrate,
   a first spacer provided on one of said base part and said cover part; and
   a second spacer provided on the other of said base part and said cover part, wherein said base part and cover part are adjacent and wherein corresponding ones of said first and second spacers are in direct mechanical and thermal contact and define a height of the space inside the housing.

2. The modular housing according to claim 1, wherein the housing further comprises one or more intermediate parts between the base part and the cover part.

3. The modular housing according to claim 1, wherein the parts of the housing are integrally constructed in one-piece.

4. The modular housing according to claim 1, wherein the substrate is placed between said base and cover parts and has a through hole therein, and wherein said first and second spacers are in abutting contact inside the through hole.

5. The modular housing according to claim 1, wherein a spacer from one of said first and second spacers includes a hole for fastening means.

6. The modular housing according to claim 1, wherein a spacer from one of said first and second spacers is part of a wall and/or said first and second spacers are a dividing wall.

7. The modular housing according to claim 1, wherein the substrate has a through hole to accommodate said first and second spacers.

8. The modular housing according to claim 1, wherein an arrangement of the dividing walls on opposite sides of a substrate is identical in position.

9. The modular housing according to claim 1, further comprising an intermediate part having a dividing wall extending parallel to the substrates.

10. The modular housing according to claim 1, wherein the outer walls of adjacent parts of the housing overlap.

11. The modular housing according to claim 1, further comprising an elastic, electrically conductive gasket located at an edge or at an overlap of an outer wall.

12. The modular housing according to claim 1, further comprising an elastic, electrically conductive gasket fixed on an edge of a wall in contact with a substrate.

13. The modular housing according to claim 12, wherein gaskets contact exclusively one side of a substrate.

14. The modular housing according to claim 12, wherein the diameter of the outer walls and/or the dividing walls and/or the spacers varies.

15. A circuit board assembly, comprising:
   a first part;
   a second part, adjacent to the first part;
   a first spacer on the first part extending toward the second part; and
   a substrate, having electronic components thereon, disposed between the first and second parts, the substrate having a through hole therein, wherein the first spacer extends into the through hole.

16. The circuit board assembly according to claim 15, wherein the first spacer extends past the substrate.

17. The circuit board assembly according to claim 15, wherein the second part further comprises a second spacer opposed to the first spacer, so that the first and second spacers directly abut each other inside the through hole in the substrate.

18. The circuit board assembly according to claim 15, wherein the first part is a base and the second part is an intermediate part.

19. The circuit board assembly according to claim 18, further comprising a cover, wherein the intermediate part is disposed between the base and the cover.

20. The circuit board assembly according to claim 15 having a plurality of first and second spacers which oppose and directly abut each other.

21. The circuit board assembly according to claim 15, wherein the through hole in the substrate is larger than the spacer received therein, so that a gap is formed between the through hole and the spacer to accommodate a difference in respective thermal expansion coefficients of the substrate and spacer.

* * * * *